United States Patent [19]
Matsushiro et al.

[11] Patent Number: 5,317,153
[45] Date of Patent: May 31, 1994

[54] SCANNING PROBE MICROSCOPE

[75] Inventors: Hiroyuki Matsushiro, Machida; Tetsuji Onuki, Yokohama; Masaya Miyazaki; Yasushi Fukutomi, both of Kawasaki, all of Japan

[73] Assignee: Nikon Corporation, Tokyo, Japan

[21] Appl. No.: 922,505

[22] Filed: Jul. 31, 1992

[30] Foreign Application Priority Data

Aug. 8, 1991 [JP] Japan ................................ 3-198155
Aug. 9, 1991 [JP] Japan ................................ 3-200835

[51] Int. Cl.$^5$ .......................................... H01J 37/26
[52] U.S. Cl. ...................................... 250/306; 73/105
[58] Field of Search .................. 250/306, 307; 73/105

[56] References Cited

U.S. PATENT DOCUMENTS 4,908,519  3/1990  Park et al. .......................... 250/306
4,935,634  6/1990  Hansma et al. ..................... 250/560
4,999,495  3/1991  Miyata et al. ....................... 250/306

FOREIGN PATENT DOCUMENTS 0373742  6/1990  European Pat. Off. .
0421355  4/1991  European Pat. Off. .
2-163601  6/1990  Japan .
3-4102    1/1991  Japan .

OTHER PUBLICATIONS

Patent Abstracts of Japan, vol. 015, No. 309 (P-1235), Aug. 7, 1991.
R. Guckenberger et al, "Design of a Scanning Tunneling Microscope for Biological Applications", Journal of Vacuum Science and Technology: Part A, vol. 6, No. 2, Mar. 1, 1988, pp. 383-385.
M. Okano et al, "Vibration Isolation for Scanning Tunneling Microscopy", Journal of Vacuum Science and Technology A, vol. 5, No. 6, Nov. 1, 1987, pp. 3313-3320.

Primary Examiner—Jack I. Berman
Attorney, Agent, or Firm—Shapiro and Shapiro

[57] ABSTRACT

A scanning probe microscope, capable of achieving a resolving power of atomic level, is provided with a probe microscope unit 5, 6, 17 for measuring a fine constitution of sample surface with a probe 5, and with an optical microscope unit 8, 10-16 for observing an optical image of sample, in which the probe microscope unit is encased in a box 9 shielded against external noises and electromagnetic waves. The box has a shape of a cone such as triangular cone, which is placed on a triangular surface plate.

15 Claims, 5 Drawing Sheets

FIG. 5

| | a | b | c | d | e |
|---|---|---|---|---|---|
| | square 342×342 | triangle, base 450, 60°, sides 520 | trapezoid, 234/342, 72.47°, 450 | trapezoid, 85/400, 62.58°, 500 | trapezoid, 65/400, 60.37°, 520 |
| Vp | 861Hz | 956Hz | 895Hz | 947Hz | 971Hz |
| h/ℓ | 100% | 86% | 76% | 80% | 77% |

| | f | g | h | i | j |
|---|---|---|---|---|---|
| | trapezoid, 268/350, 79.32°, 400 | trapezoid, 425, 57.08°, 550 | trapezoid, 60/416, 62.24°, 500 | trapezoid, 149/350, 68.05°, 520 | trapezoid, 119/350, 58.35°, 550 |
| Vp | 874Hz | 883Hz | 985Hz | 942Hz | 880Hz |
| h/ℓ | 88% | 77% | 84% | 67% | 64% |

SCANNING PROBE MICROSCOPE

BACKGROUND OF THE INVENTION

1. Field of the Invention

The present invention relates to a scanning probe microscope. More specifically, the invention relates to a fully vibration-isolated probe microscope.

2. Related Background Art

A scanning probe microscope (SPM) such as a scanning tunneling microscope (STM) and a scanning atomic force microscope (SAFM) is for measuring a fine surface constitution in a local area on a sample with a resolving power of atomic level. There have recently been presented or proposed scanning probe microscopes incorporated with a conventional optical microscope to satisfy demands to observe a relatively large sample and to actually check a portion which is to be measured.

For example, a scanning tunneling microscope (as will be referred to as STM), which is disclosed in Japanese Patent Application Laid-open No. 2-163601 corresponding to U.S. Pat. No. 4,999,495, is provided with a support arm using a part of structure of a conventional optical microscope, to which an objective lens of the optical microscope and a detection portion of STM are individually attached. Another STM is disclosed in Japanese Patent Application Laid-open No. 3-4102, in which an objective lens and an STM detection portion are individually attached to an objective revolver, whereby alternate observations may be conducted by switching the revolver between an optical microscopic image and an STM image.

Although a very weak electric current is measured in the conventional STM's, an STM unit comprising a probe, a scanner, and an IV amplifier is set as exposed to an external environment or in a similar condition, while unprotected against external electromagnetic noises. Further, in spite that a sample is measured on an order of atomic level, external noises are readily transmitted to the STM unit, presenting a further problem.

In addition, a reduction in resonance frequency is caused by a cantilever structure of the support arm of an optical microscope or by mechanically operating portions such as a mechanism for vertical motion of the objective lens and a revolving part of the revolver. The reduction in resonance frequency leads to insufficient stiffness properties, which in turn results in easy transmission of vibrations of the microscope main body to the detection portion of the STM. The vibrations may cause an inability of achieving a resolving power of atomic level, presenting a still further problem.

It will be appreciated that an excellent vibration isolating property is necessary for a vibration isolating apparatus on which the STM is mounted. A surface plate of conventional vibration isolating apparatus usually has a square or rectangular mount plane, and is supported by four air springs or vibration isolating rubbers located on a square or rectangular frame. The air springs or vibration isolating rubbers have a natural oscillation frequency in a low frequency range, with that of the surface plate being in a high frequency range. In order to improve the vibration isolating property of vibration isolating apparatus, it is preferable to make a difference greater between the natural oscillation frequencies of air springs or vibration isolating rubbers and of the surface plate. Increasing the thickness of surface plate is a method to increase the natural oscillation frequency of the surface plate, but also increases its weight, presenting still another problem.

SUMMARY OF THE INVENTION

It is an object of the present invention to provide a scanning probe microscope capable of achieving a resolving power of atomic level free of external electromagnetic waves and external noises.

It is another object of the present invention to provide a scanning probe microscope maintaining high stiffness properties.

It is still another object of the present invention to provide a scanning probe microscope provided with a vibration isolating apparatus with high vibration isolating property.

A scanning probe microscope according to the present invention is provided with a probe microscope unit for electrically processing information obtained by a relative scan of a probe to a sample to measure a fine constitution of a surface of the sample, and with an optical microscope unit for observing an optical image of the sample, in which the probe microscope unit is encased in a box shielded against external noises and electromagnetic waves. The box protects the probe microscope unit against noises of vibrations or sounds in an operating frequency band (several Hz to several kHz) of the probe microscope and against electromagnetic noises which may affect the detection of very weak electric current of several nA. This arrangement permits achievement of measurement precision in a resolving power of atom irrespective of surrounding environment.

It is preferable that the box has side faces formed in a cone. More preferably, the side faces are in a triangular pyramid. Since the box with side faces in a cone has no parallel planes facing each other therein, a standing wave is prevented from being generated inside the box. Especially, the structure of triangular pyramid increases the resonance frequency as well as the stiffness properties.

In a preferred embodiment according to the present invention, the box is mounted on a surface plate, on which the probe microscope unit is mounted, and supports the optical microscope unit, and the probe microscope unit is supported by a column disposed inside the box without a contact therewith. This arrangement enables to increase the resonance frequency of the STM unit itself, and is stiffer against vibrations in the above operating frequency band.

In an embodiment according to the present invention, a mount plane of a surface plate is formed in polygon with paired edges adjacent to each other but not perpendicular to each other. In detail, the mount plane of the surface plate comprises three edges respectively corresponding to three edges of a virtual triangle, each of which constitutes at least a part of corresponding edge of virtual triangle.

Since the mount plane has the edges constituting a virtual triangle, such a surface plate is unlikely to generate a standing wave in the low frequency range, as compared to the conventional square and rectangle surface plates. Therefore, the natural oscillation frequency may be increased without increase in thickness of the surface plate, improving the vibration isolating property.

BRIEF DESCRIPTION OF THE DRAWINGS

FIG. 5 is a drawing to show relations between various shapes of surface plate and natural oscillation frequencies;

DESCRIPTION OF THE PREFERRED EMBODIMENTS

Figure 1:
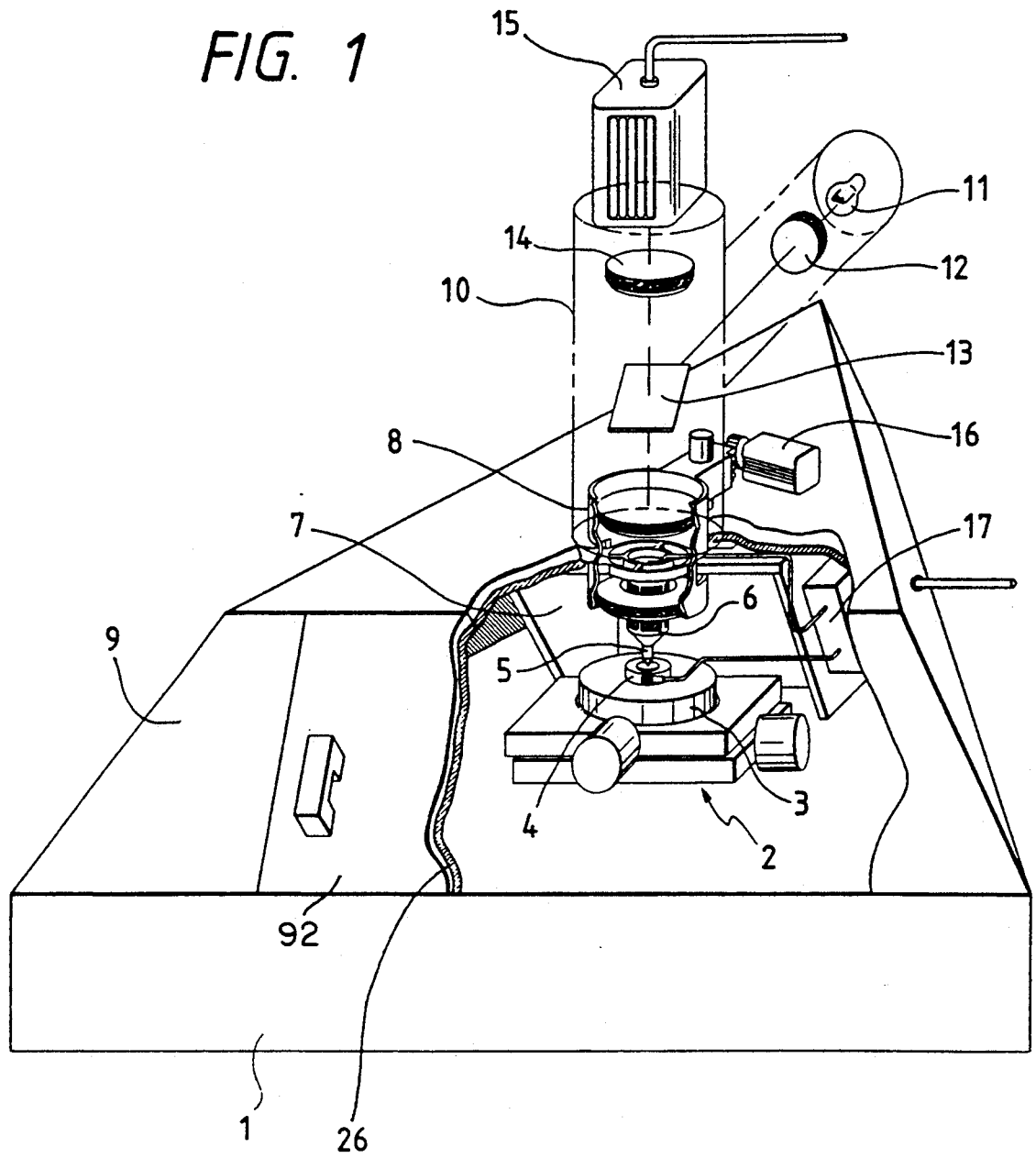
FIG. 1 is a perspective view (partly in section to show an internal structure) of a microscope in an embodiment according to the present invention.
Figure 2:
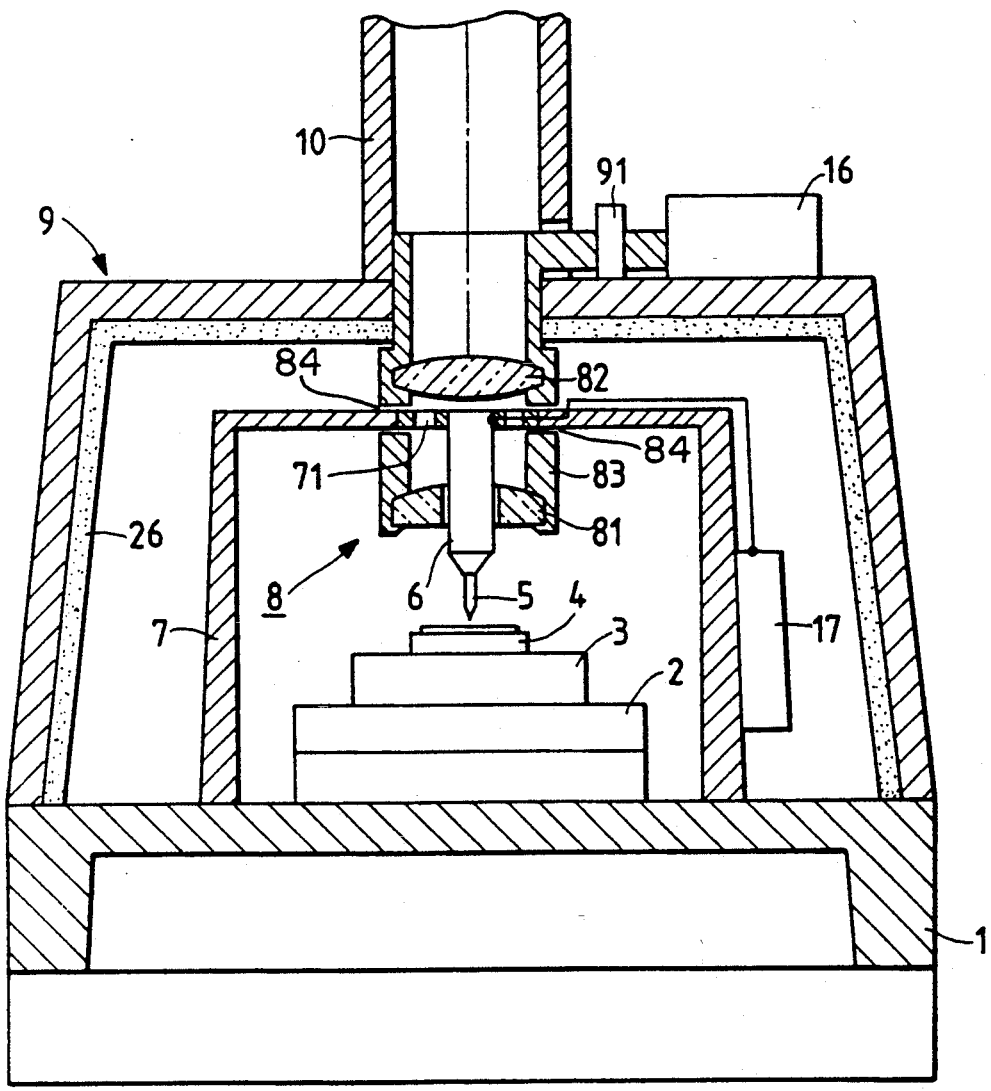
FIG. 2 is a sectional view to schematically show a principle of the support structure of the microscope in the embodiment of FIG. 1.

FIG. 1 shows an appearance and an internal structure of a scanning tunneling microscope (STM) in a preferred embodiment according to the present invention. FIG. 2 schematically shows a principle of a support structure. In FIGS. 1 and 2, a triangle surface plate 1 is mounted on a vibration isolating table for removing vibrations through the floor, and an xy-coarse movement stage 2 is disposed on an upper surface of the surface plate 1. A z-coarse movement stage 3 with a sample holder 4 attached thereto is mounted on the xy-coarse movement stage 2.

A tube scanner 6 holds a probe 5 for detecting a tunnel current. The tube scanner 6 comprises a cylindrical piezoelectric member and a plurality of electrodes disposed on the inside and the outside planes thereof. The tube scanner 6 is fixed through a disk support frame 71 to an inner column 7 disposed on the surface plate 1. The inner column 7 is of material and structure of high stiffness. Although the disk support frame 71 is formed of an opaque disk with through holes for light transmission in the present embodiment, the support frame 71 may be formed of light transmitting glass or plastics.

An optical microscope unit 10 is mounted on the upper portion of an outside box 9. The optical microscope unit 10 is composed of an objective lens 8, an illumination light source 11, an illumination lens 12, a half mirror 13, an imaging lens 14, a television camera 15, and a focusing drive unit 16.

The objective lens 8 is composed of a first objective lens 81 for converting an optical flux from a sample into a collimated flux, a second objective lens 82 for condensing the collimated flux, and a lens barrel 83 holding the first and the second lenses. The objective lens 8 fits in an opening through the upper face of the outside box 9, so that the objective lens 8 may be slidable in the opening along an optical axis. A through hole is formed through the first objective lens 81 about the optical axis. The cylindrical tube scanner 6 as above described passes through this through hole without a contact with the lens 81. Transverse through openings 84 are formed in a side wall of the lens barrel 83 between the first objective lens 81 and the second objective lens 82. Arms of the inner column 7 pass through the openings 84 into the lens barrel 83 without contacting the lens barrel 83 to hold the disk support frame 71.

The focusing drive unit 16 vertically moves the objective lens unit 8 along a shaft 91 in the direction of the optical axis, so that an optical image of a sample may be formed on an image pickup plane of an image pickup camera 15.

An IV amplifier 17 is fixed on a side wall of the inner column 7. The IV amplifier 17 supplies a drive current to electrodes adhered to the inside face and the outside face of the cylindrical piezoelectric member of the tube scanner 6 and amplifies a tunnel current flowing between the probe 5 and a sample surface. The probe 5, the tube scanner 6, and the IV amplifier 17 constitute a probe microscope unit in the present invention.

The outside box 9 is formed in the shape of a truncated triangular pyramid having slant faces respectively meeting side edges of the triangle surface plane 1. The top face of the outside box 9 is a horizontal plane parallel to the surface plate 1. A sound absorbing material 26 is adhered to the entire inside walls of the outside box 9. The outside box 9 and the sound absorbing material 26 constitute a box in the present invention.

The outside box 9 is formed of a material with a high conductivity and a high permeability to shield the STM from electromagnetic waves from the outside. A sample change door 92 provided on the outside box 9 is made of the same material as the outside box 9, and a fitting portion to the objective lens barrel 83 is also structured against leakage of electromagnetic waves.

In order to shield external noises, the outside box 9 must be made of a material with a high density and in a considerable thickness. For example, a plate glass with a relatively low density shows a constant transmission loss irrespective of thickness, while a steel plate with a high density shows a great influence on transmission loss of sound depending on a thickness thereof. Comparing a steel plate in thickness of 5 mm with one in thickness of 1 mm, a transmission loss is increased more than 10 dB in an oscillation range below 1 kHz. The sound absorbing material 26 adhered to the inside wall of the outside box may effectively absorb sounds having frequencies above 200 Hz that have reached inside the outside box.

Standing waves may be prevented from being generated inside the box by conic side faces of the outside box 9, so that complete removal may be possible of vibration influences on the STM due to sounds. If there are parallel planes existing in a box and facing each other like a cube or like a rectangular parallelepiped, standing waves are likely to be generated with wave length corresponding to a distance between the facing planes. Therefore, it is preferable that the shape of the box is a triangular pyramid or a sphere avoiding parallel planes as much as possible. The structure of triangular pyramid increases the resonance frequency and the stiffness properties, as compared to a cube and a rectangular parallelepiped.

Normally selected for the STM are materials with a low thermal expansion coefficient such as invar to avoid an influence of temperature drift. The outside box 9 and the surface plate 1 are preferably made of such materials.

Figure 3:
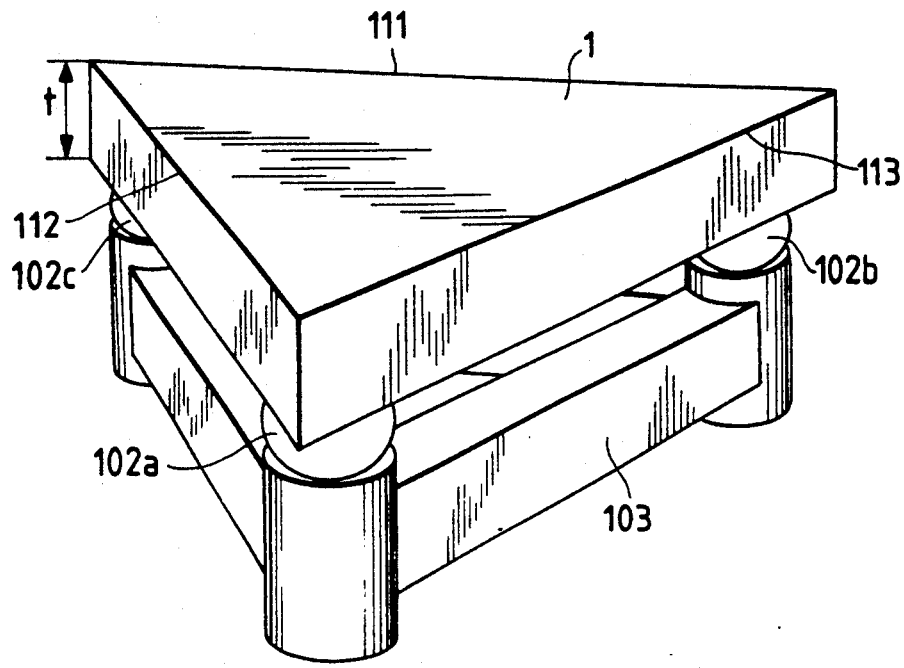
FIG. 3 is a perspective view of a vibration isolating apparatus in an embodiment according to the present invention.

Next explained with reference to FIG. 3 are the structure of the surface plate 1 and the structure of the vibration isolating apparatus supporting the STM and the surface plate.

The surface plate 1 is of a triangle shape composed of three edges 111, 112, 113, and is supported at three points by air springs 102a, 102b, 102c disposed on a frame 103. The surface plate 1 has the edges 111, 112, 113 of 450 mm and a thickness of 30 mm, in which adjacent two edges of the mount plane span an angle of 60 degrees forming a regular triangle.

Figure 4:
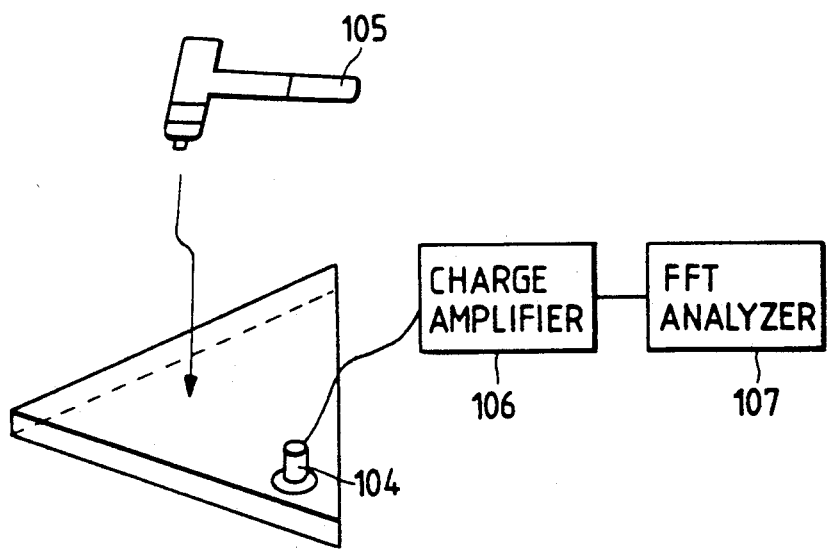
FIG. 4 is a drawing to illustrate a method for measuring a natural oscillation frequency.

A natural oscillation frequency of this surface plate 1 was measured in a method as shown in FIG. 4. An acceleration pickup 104 was attached to the surface plate 1. A vibration hammer 105 hit the surface plate 1 to forcedly vibrate the surface plate 1. Vibrations detected by the acceleration pickup 104 were converted into electric signals by a charge amplifier 106. After the conversion, the electric signals were input into an FFT analyzer 107 to analyze frequencies of electric signals so as to detect outstanding frequencies in all frequency components contained in oscillation waveforms. The outstanding frequencies are natural oscillation frequencies, and the lowest frequency out of the natural oscillation frequencies is defined as a primary natural oscillation frequency.

Measuring as above, a primary natural oscillation frequency (Vp) of the surface plate 1 was 956 Hz as shown by b in FIG. 5. Measured as a comparative example in the same manner was a square surface plate with each edge of 342 mm and a thickness of 30 mm as shown by a in FIG. 5. A primary natural oscillation frequency of the comparative square surface plate was 861 Hz. Therefore, the surface plate 1 of the present embodiment is high in natural oscillation frequency, which in turn in excellent in vibration isolating property. The surface plate of the comparative example was made of the same material and in the same volume as the surface plate 1 of the present embodiment.

Other surface plates as shown by c-j in FIG. 5 were made, and their natural oscillation frequencies were measured in the above method. These surface plates had two edges adjacent to each other but not perpendicular to each other in peripheries of their mount planes, and some of peripheral edges constitute a virtual triangle alone or in combination with their extension lines. A material for these surface plates was identical to that of the surface plate 1, and a thickness and a length of each edge were determined to define the same volume as the surface plate 1.

Measurement results showed that all the surface plates as shown by c-j in FIG. 5 had higher natural oscillation frequencies than the square surface plate of comparative example as shown by a in FIG. 5. Specifically, it was observed that the surface plates with one of base angles of the mount plane being 59 to 64 degrees and with a height h of the mount plane in plan view being 75 to 90% of a length l of base edge thereof had higher natural oscillation frequencies, and therefore were excellent in vibration isolating property.

Figure 6:
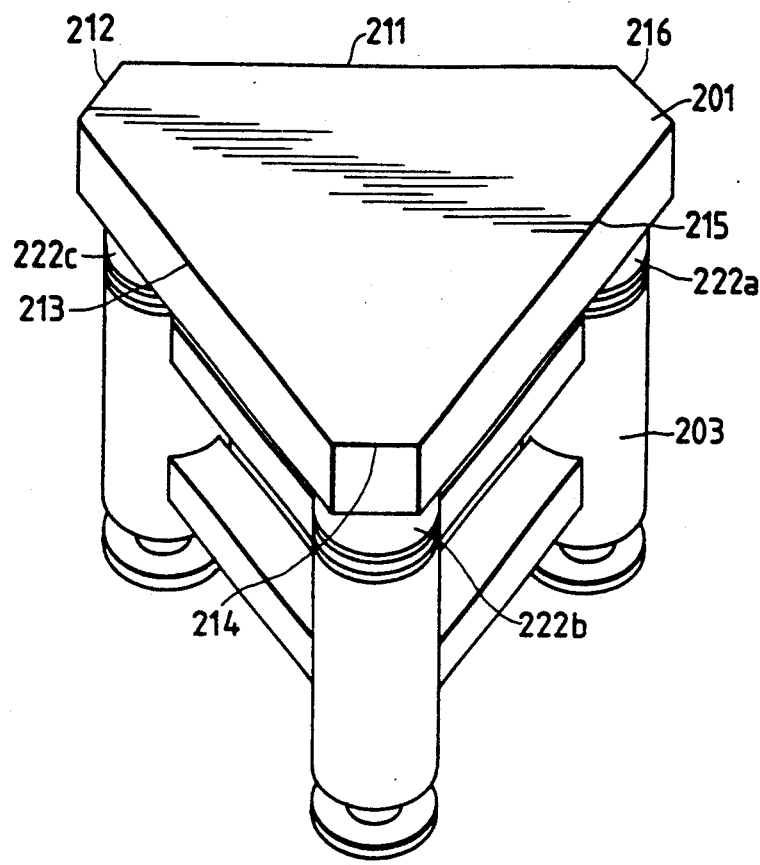
FIG. 6 is a perspective view of a vibration isolating apparatus in another embodiment according to the present invention.
Figure 7A:
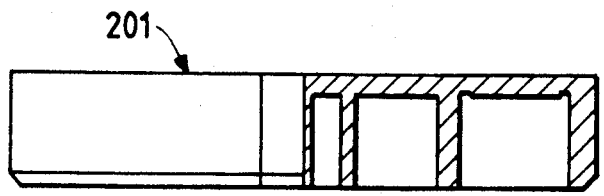
FIG. 7A is a view of the surface plate of FIG. 6 partly in section.
Figure 7B:
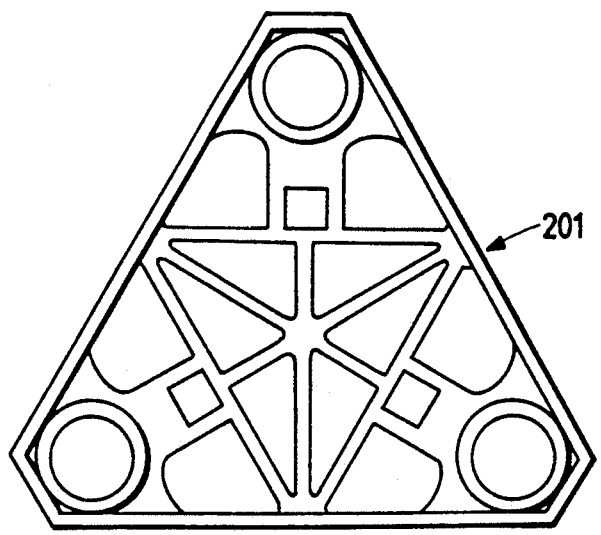
FIG. 7B is a bottom view of the surface plate of FIG. 6.

The second embodiment of the present invention is explained in the following with reference to FIG. 6. A surface plate 201 as shown in FIG. 6 has a mount plane of hexagon shape which has alternate longer edges 211, 213, 215 of length of 680 mm and shorter edges 212, 214, 216 of length of 116 mm. A thickness of the surface plate 201 is 150 mm. The longer edges and their extension lines form a regular triangle. The surface plate 201 is supported at three points by air springs 222a, 222b, 222c disposed on a frame 203. The surface plate 201 is ribbed inside as shown in FIGS. 7A and 7B.

A natural oscillation frequency of the surface plate 201 was measured in the method of FIG. 4, and was 760 Hz. A square surface plate with similar rib structure, which had the same surface area and edges of 450 mm×450 mm, had a natural oscillation frequency of 587 Hz. Thus the surface plate 201 of the present embodiment is understood to have an excellent vibration isolating property.

As above explained, if a surface plate is produced with a higher natural oscillation frequency as in the respective embodiments according to the present invention, a difference can be enlarged between natural oscillation frequencies of a surface plate and of vibration isolating rubbers or air springs, improving the vibration isolating property of a vibration isolating apparatus.

What is claimed is:

1. A scanning probe microscope comprising:
   a surface plate;
   a probe microscope unit disposed on said surface plate for electrically processing information obtained by a relative scan of a probe to a sample to measure a fine constitution of a surface of said sample;
   an optical microscope unit disposed on said surface plate spatially independently of said probe microscope unit for observing an optical image of said sample; and
   a box having side faces arranged in a conic form, and encasing said probe microscope unit for shielding said probe microscope unit against external noises and electromagnetic waves.

2. A scanning probe microscope according to claim 1, wherein said box is formed of a material with a high conductivity and a high permeability, and wherein a sound absorbing material is provided on an interior surface thereof.

3. A scanning probe microscope according to claim 1, wherein said side faces of box are arranged in a form of a triangular cone.

4. A scanning probe microscope according to claim 3, wherein said surface plate supports said probe microscope unit, said optical microscope unit, and said box, and wherein said surface plate has a triangular mount plane corresponding to a shape of said box in a plan view.

5. A scanning probe microscope according to claim 1, further comprising a column disposed inside said box without contact therewith, wherein said optical microscope unit is supported by said box, and wherein said probe microscope unit is supported by said column.

6. A scanning probe microscope comprising:
   a surface plate having a mount plane of polygon shape with paired edges adjacent to each other but not perpendicular to each other; and
   a probe microscope unit disposed on said mount plane for measuring a fine constitution of a surface of a sample.

7. A scanning probe microscope according to claim 6, wherein said adjacent paired edges form an angle of less than 90 degrees.

8. A scanning probe microscope according to claim 7, wherein said polygon is a triangle.

9. A scanning probe microscope according to claim 8, wherein at least one of two base angles of said triangle is between 59 and 64 degrees, and said triangle has a height of 75 to 90% of base length.

10. A scanning probe microscope according to claim 7, wherein said polygon is a trapezoid.

11. A scanning probe microscope according to claim 10, wherein at least one of two base angles of said trapezoid is between 59 and 64 degrees, and said trapezoid has a height of 75 to 90% of base length.

12. A scanning probe microscope according to claim 6, wherein said mount plane comprises three edges respectively corresponding to three edges of a virtual triangle, and each of said three edges of the mount plane constitutes at least a part of a corresponding edge of said virtual triangle.

13. A scanning probe microscope according to claim 12, wherein an outer periphery of said mount plane is a hexagon with alternate longer and shorter edges.

14. A scanning probe microscope according to claim 12, further comprising a frame member supporting said surface plate at three points.

15. A scanning probe microscope assembly comprising:
   a base;
   a scanning probe microscope mounted on said base; and
   means for shielding the scanning probe microscope against vibration and electromagnetic radiation, said shielding means including a box having side faces arranged in a conic form and encasing said probe microscope.

* * * * *